(12) United States Patent
Imai (10) Patent No.: US 11,121,779 B2
(45) Date of Patent: Sep. 14, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Hitoshi Imai, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 238 days.

(21) Appl. No.: 16/298,155

(22) Filed: Mar. 11, 2019

(65) Prior Publication Data

US 2020/0076513 A1 Mar. 5, 2020

(30) Foreign Application Priority Data

Aug. 28, 2018 (JP) .............................. JP2018-159122

(51) Int. Cl.
| | |
|---|---|
| *H04B 10/80* | (2013.01) |
| *H04B 10/67* | (2013.01) |
| *H04B 10/50* | (2013.01) |
| *H01L 25/18* | (2006.01) |

(52) U.S. Cl.
CPC .......... *H04B 10/802* (2013.01); *H01L 25/18* (2013.01); *H04B 10/502* (2013.01); *H04B 10/671* (2013.01)

(58) Field of Classification Search
CPC .. H04B 10/502; H04B 10/671; H04B 10/802; H01L 25/167; H01L 25/18

USPC ......................................................... 250/551
See application file for complete search history.

(56) References Cited

U.S. PATENT DOCUMENTS

| | | | |
|---|---|---|---|
| 9,245,911 B2* | 1/2016 | Minagawa | .......... H01L 27/0727 |
| 9,859,260 B2 | 1/2018 | Tagami et al. | |
| 10,107,857 B2 | 10/2018 | Takai | |
| 2012/0268649 A1* | 10/2012 | Kurokawa | .......... H04N 5/23245 |
| | | | 348/370 |
| 2014/0284629 A1 | 9/2014 | Takai et al. | |

FOREIGN PATENT DOCUMENTS

| | | | |
|---|---|---|---|
| JP | H05-020008 A | | 1/1993 |
| JP | 10150217 A | | 6/1998 |
| JP | 2009170993 A | | 7/2009 |
| JP | 2009-276219 A | | 11/2009 |
| JP | 2013098471 A | * | 5/2013 |
| JP | 2015-15602 A | | 1/2015 |
| JP | 2015011784 A | | 1/2015 |

(Continued)

*Primary Examiner* — Kevin K Pyo (74) *Attorney, Agent, or Firm* — White & Case LLP (57) ABSTRACT

A semiconductor device includes light-emitting elements, a selection circuit, a control circuit, light-receiving elements, and switch elements. The selection circuit is configured to accept one input signal and output a signal for selecting an element to emit light among the light-emitting elements. The control circuit is configured to control the light-emitting elements, based on the signal outputted from the selection circuit. The light-receiving elements are each configured to receive light of each of the light-emitting elements and generate a signal for driving a switch, based on a light-receiving state. The switch elements are each configured to be driven by application of voltage outputted from each of the light-emitting elements.

19 Claims, 7 Drawing Sheets

(56) References Cited

FOREIGN PATENT DOCUMENTS

| JP | 2016-66817 A | 4/2016 |
| JP | 2016207543 A | 12/2016 |
| JP | 2017112538 A | 6/2017 |

\* cited by examiner

| STATE | INPUT POWER SUPPLY[V] | ON/OFF STATE | |
|---|---|---|---|
| | | SWITCH 22A | SWITCH 22B |
| 1 | 0.0 ~ 1.0 | OFF | OFF |
| 2 | 1.5 ~ 2.5 | ON | OFF |
| 3 | 3.0 ~ 4.0 | OFF | ON |
| 4 | 4.5 ~ | ON | ON |

| STATE | INPUT DUTY RATIO [%] | ON/OFF STATE | |
|---|---|---|---|
| | | SWITCH 22A | SWITCH 22B |
| 1 | 0 ~ 15 | OFF | OFF |
| 2 | 25 ~ 40 | ON | OFF |
| 3 | 50 ~ 65 | OFF | ON |
| 4 | 75 ~ | ON | ON |

SEMICONDUCTOR DEVICE

CROSS REFERENCE TO RELATED APPLICATIONS

This application is based upon and claims the benefit of priority from the prior Japanese Patent Application No. 2018-159122, filed on Aug. 28, 2018, the entire contents of which are incorporated herein by reference.

FIELD

The embodiments of the present invention relate to a semiconductor device.

BACKGROUND

Examples of a device that electrically switches between switches include a contact relay and a noncontact relay. The noncontact relay is generally longer in life than the contact relay. A photo relay using a semiconductor element is one kind of the noncontact relay and has, as compared with the contact relay, advantages in footprint, reliability, switching characteristics and so on, and is used, in particular, as a substitute for a signal relay of the contact relay. A conventional photo relay realizes one relay function by controlling one output with respect to one input signal. However, in such a configuration, when the number of required relays is increased, the number of inputs is proportionately increased, resulting in complicated control signal design, control substrate pattern design, and so on.

DETAILED DESCRIPTION

According to one embodiment, a semiconductor device includes light-emitting elements, a selection circuit, a control circuit, light-receiving elements, and switch elements. The selection circuit is configured to accept one input signal and output a signal for selecting an element to emit light among the light-emitting elements. The control circuit is configured to control the light-emitting elements, based on the signal outputted from the selection circuit. The light-receiving elements are each configured to receive light of each of the light-emitting elements and generate a signal for driving a switch, based on a light-receiving state. The switch elements are each configured to be driven by application of voltage outputted from each of the light-emitting elements.

Embodiments will now be explained with reference to the accompanying drawings. The present invention is not limited to the embodiments.

In the drawings to be referred to, the same codes or similar codes are given to the same portions or portions having similar functions, and duplicated explanation thereof may be omitted. Further, the dimensional ratios in the drawings may be different from the actual ratios for convenience of explanation and a part of the configuration may be omitted from the drawings.

First Embodiment

Figure 1:
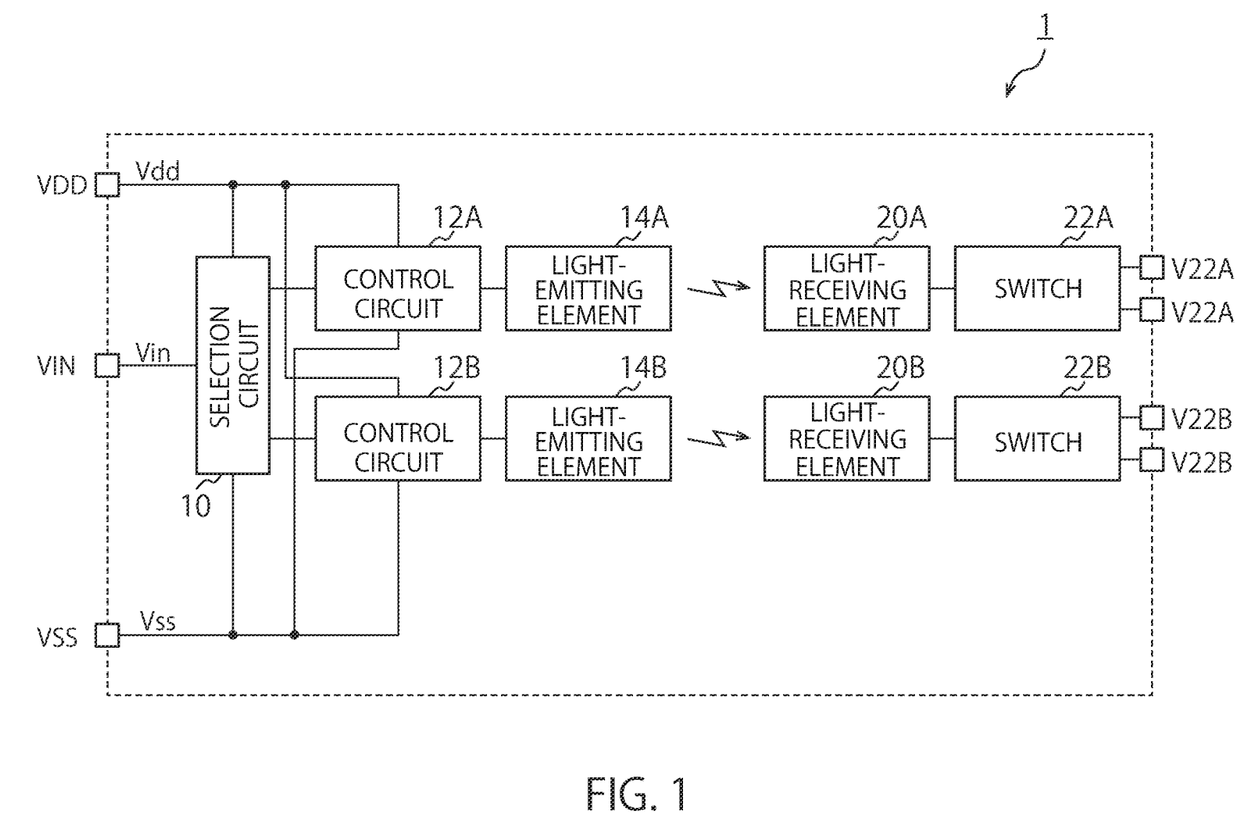
FIG. 1 schematically illustrates functions of a semiconductor device according to an embodiment.

FIG. 1 is a diagram illustrating the outline of a semiconductor device 1 according to a first embodiment. The semiconductor device 1 includes a selection circuit 10, control circuits 12A, 12B, light-emitting elements 14A, 14B, light-receiving elements 20A, 20B, and switches 22A, 22B. The semiconductor device 1 is configured such that the light-emitting element emits light on the basis of an input signal of one channel, whereby the light-receiving element received the emitted light generates voltage and drives the multichannel switch by the voltage. The light-emitting element and the light-receiving element are in a relationship found, for example, in a photo relay. To perform the operations, voltages Vdd, Vss which are reference voltages are supplied from an external part via input terminals VDD, VSS.

The selection circuit 10 is a circuit that outputs a selection signal for selecting an element to be caused to emit light, namely, a switch to be turned on, based on the inputted signal, and is connected to an input terminal VIN and is configured such that its outputs are connected to the control circuits that control the respective light-emitting elements. In this embodiment, the inputted signal is a signal of one channel.

The control circuit 12 is a circuit that is connected to the selection circuit 10 and drives the light-emitting element 14 on the basis of the signal inputted from the selection circuit 10. For example, when the light-emitting element 14 is an LED (Light Emitting Diode), the control circuit 12 is a circuit that functions as a so-called LED driver. Since the semiconductor device 1 controls a plurality of switches 22, a plurality of control circuits 12 exist corresponding to the plurality of switches 22, respectively. In the example of FIG. 1, the semiconductor device 1 controls two switches 22, so that the control circuits 12A, 12B are provided corresponding to the switches 22A, 22B, respectively.

The light-emitting elements 14A, 14B are elements that are connected to the control circuits 12A, 12B respectively and controlled by the control circuits 12A, 12B to emit light, and are constituted including, for example, LEDs, respectively. Not limited to the LED, but also a higher-power LD (Laser Diode), a surface-emitting laser or the like is adoptable.

The light-receiving elements 20A, 20B are elements each of which receives light emitted from each of the light-emitting elements 14A, 14B and outputs voltage based on the received light, and is constituted including, for example, a photodiode.

The light-emitting elements 14A, 14B and the light-receiving elements 20A, 20B emit light to corresponding elements respectively and receive light emitted from the corresponding elements respectively. The light-receiving elements 20A, 20B are insulated from the terminals VDD, VSS, VIN, the selection circuit 10, the control circuits 12A, 12B, and the light-emitting elements 14A, 14B, for example, via a dielectric, a resin or the like transparent to the emission wavelengths of the light-emitting elements. The light-emitting element 14A and the light-receiving element 20A are optically shielded from the light-emitting element 14B and the light-receiving element 20B so that the light emitted from each of the light-emitting elements is not received by the light-receiving element other than the corresponding light-receiving element.

Optical shielding is realized, for example, by make pairs of the light-emitting element and the light-receiving element using a substance absorbing the frequency of the light emitted from the light-emitting element and generating a shielding wall between the pairs. An example thereof may be a structure made by bonding at least the light-emitting element and the light-receiving element with a transparent insulative resin, insulation-mounting them on a MOSFET element being a switch, and covering the element pair with a light-shielding resin to suppress crosstalk of light between the element pairs, and can greatly reduce the package size as compared with the case where the elements are planarly arranged on a frame or a substrate. In another example, the frequencies of light emitted from the light-emitting elements 14A, 14B are made different, and frequency characteristics of light received by the light-receiving elements 20A, 20B are set to contain the frequencies of light emitted by the corresponding light-emitting elements 14A, 14B, respectively. In this case, each of the light-receiving elements may be the one that does not generate voltage even when receiving the light of the frequency of the different light-emitting element.

The switches 22A, 22B are switches that are connected to the light-receiving elements 20A, 20B, respectively, and controlled by the voltages outputted from the light-receiving elements 20A, 20B as drive voltages, respectively. Each of the switches is constituted including, for example, a MOSFET. The switches include output terminals V22A, V22B and switch the energization states of the circuits connected to the terminals.

Note that between the light-receiving element 20 and the switch 22, a circuit may be included which controls the voltage outputted from the light-receiving element 20 to become a voltage for driving the switch 22. As another example, the switch 22 may include the circuit that performs the control.

Figure 2:
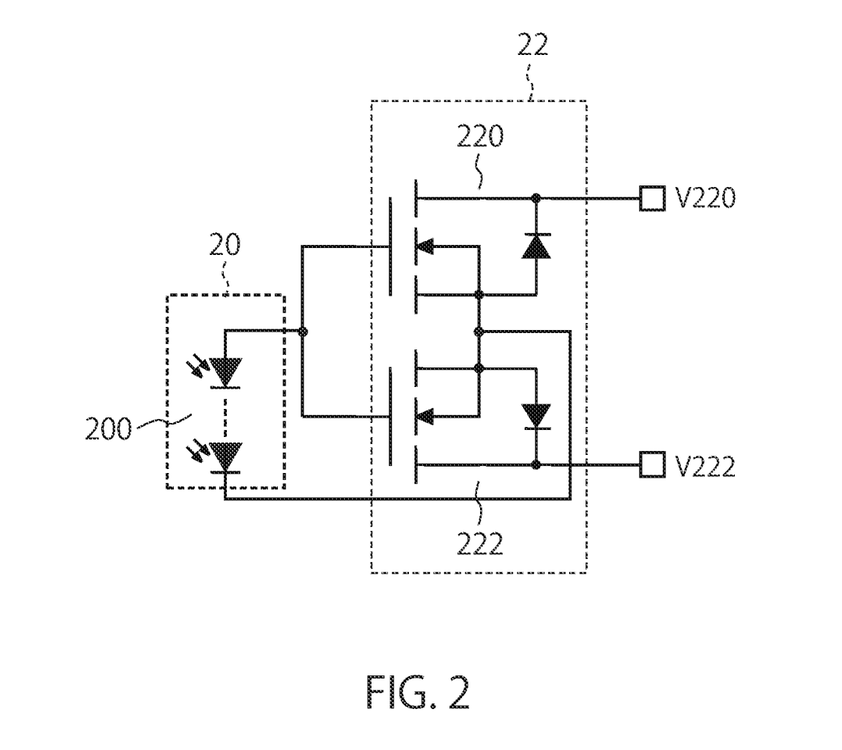
FIG. 2 illustrates an example of a circuit of a switch according to an embodiment.

FIG. 2 is a diagram illustrating an example of a combination of the light-receiving element 20 and the switch 22. The light-receiving element 20 includes, for example, a plurality of photodiodes 200. When receiving the light from the corresponding light-emitting element 14, the photodiode 200 generates and outputs electromotive force. Note that in the case of a light-receiving element of sufficiently high in conversion efficiency, the light-receiving element is not necessarily composed of a plurality of photodiodes in an array form but may include one photodiode 200.

The switch 22 includes, for example, n-type MOSFETs 220, 222. The two MOSFETs have gates connected to each other via the photodiode 200, sources connected to each other, and drains each connected to one of the output terminals V220, V222.

Connection (source common connection) of the photodiodes 200 and the MOSFETs 220, 222 as illustrated in FIG. 2 turns on the switch 22 to bring V220 and V222 into electrical connection when the photodiode 200 receives light of a predetermined intensity or higher. The plurality of light-receiving elements 20 and switches 22 included in the semiconductor device 1 have the structure illustrated as an example in FIG. 2.

As illustrated in FIG. 1, when the two switches are provided, there are four states such as a state where both the switches 22A, 22B are OFF, a state where the switch 22A is ON and the switch 22B is OFF, a state where the switch 22A is OFF and the switch 22B is ON, and a state where both the switches 22A, 22B are ON.

The input signal is a signal including information capable of selecting the four states. The selection circuit 10 selects one of the four states from the input signal and controls, base on the selected state, whether the control circuits 12A, 12B cause the light-emitting elements 14A, 14B to emit light. For example, when the signal is not inputted into the terminal VIN, the selection circuit 10 outputs nothing, so that both the control circuits 12A, 12B do not perform the control of causing the light-emitting elements 14A, 14B to emit light.

As another example, when it is desired to create a state where the switch 22A is turned on and the switch 22B is turned off, the signal based on the state is inputted into the terminal VIN. The selection circuit 10 outputs to the control circuit 12A a signal for controlling the light-emitting element 14 to emit light so as to turn on the switch 22A, and does not output any signal to the control circuit 12B so as to turn off the state of the switch 22B. Alternatively, the selection circuit 10 may output to the control circuit 12B a signal for explicitly causing the light-emitting element 14 not to emit light. When the signal for causing the light-emitting element 14A to emit light is inputted from the selection circuit 10, the control circuit 12A outputs to the light-emitting element 14A voltage (or current or the like) of causing the light-emitting element 14 to emit light. The light-receiving element 20A receives the light emitted from the light-emitting element 14A, and outputs voltage of driving the switch 22A. The switch 22A receives input of the voltage outputted from the light-receiving element 20A and thereby becomes an ON state, and electrically connects the terminals V22A.

As described above, according to this embodiment, it becomes possible to realize a photo relay of switching between a plurality of switch states with respect to one input. For example, mounting the semiconductor device 1 on an IC (Integrated Circuit) enables reduction in area where the circuit is mounted and reduction in power consumption in addition to avoidance of complexity and complication of circuit design as compared with the case of using a plurality of ICs included in the photo relay of switching between states of one switch with respect to one input.

Note that though the two switches 22 are provided in the above, the number of switches 22 is not limited to this but may be an arbitrary number, for example, based on a footprint or the like of the circuit. In this case, the control circuit 12, the light-emitting element 14, and the light-receiving element 20 are provided corresponding to the number of switches 22. For example, in the case of switching between the states of n switches 22 by one input, a signal capable of determining $2^n$ states is used as the input signal, and the selection circuit 10, when receiving input of the signal, selects switches 22 in a suitable combination, namely, light-emitting elements 14 corresponding to the switches and outputs a signal for driving the light-emitting element 14 to the control circuit 12. Increasing the number of switches 22 as described above enables further improvement in the degree of freedom of circuit design.

Second Embodiment

A more concrete embodiment of the selection circuit 10 described in the above first embodiment will be described. In this embodiment, the inputted signal is an analog signal, and the selection circuit 10 is configured to cause a predetermined light-emitting element 14 to emit light based on voltage of the signal when the analog signal is inputted thereto.

Figure 3:
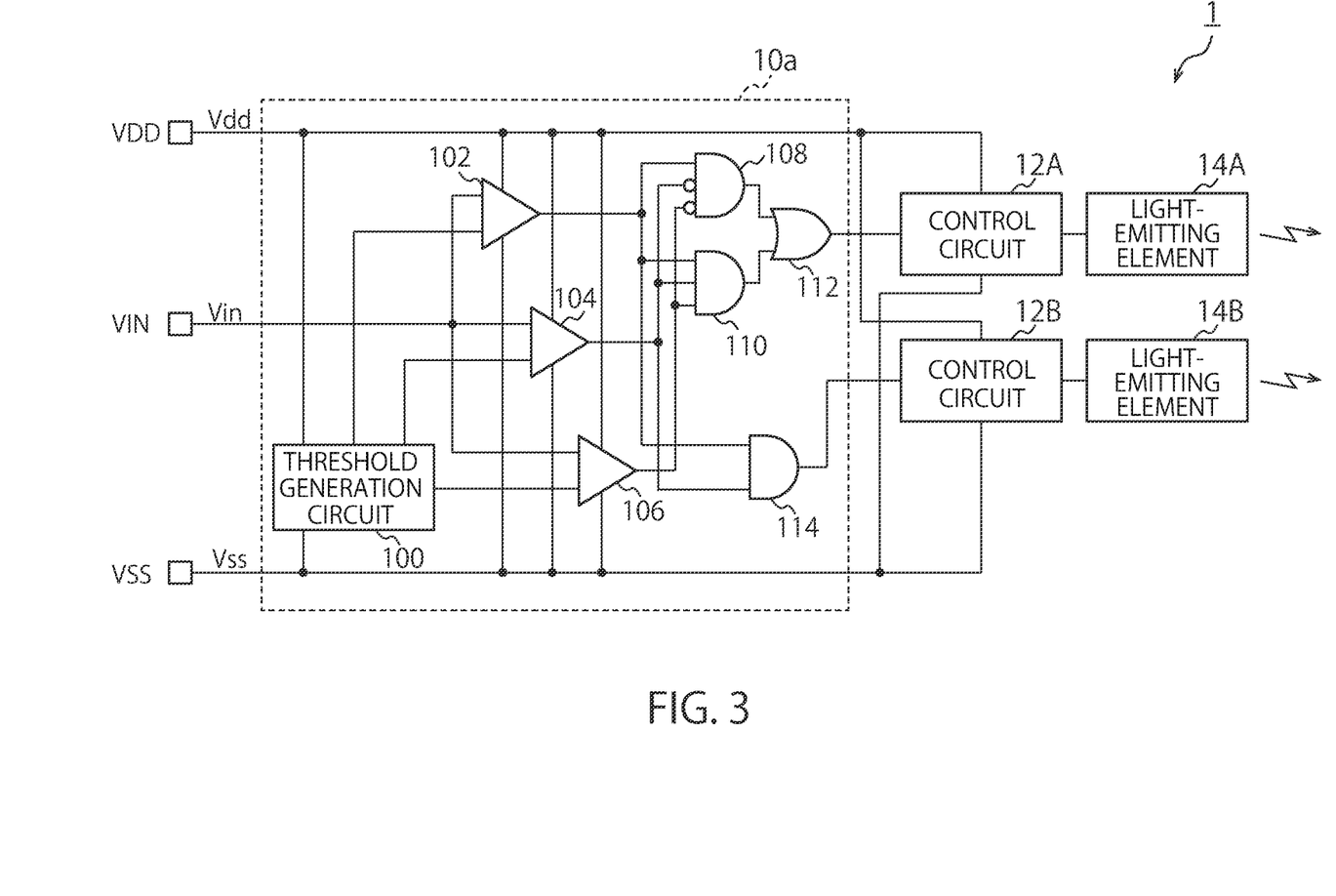
FIG. 3 illustrates an example of a circuit on an input side according to an embodiment.

FIG. 3 is a diagram illustrating a configuration on an input side according to this embodiment and, in particular, a diagram illustrating a concrete example of the selection circuit 10. A selection circuit 10*a* includes a threshold generation circuit 100, comparators 102, 104, 106, logical product circuits 108, 110, 114, and a logical sum circuit 112. The threshold generation circuit 100 and the comparators 102, 104, 106 are connected to VDD and VSS as terminals that receive the reference voltages. Further, each of the logical circuits may be connected to VDD, VSS as needed.

The threshold generation circuit 100 is a circuit that generates a threshold being a reference for each comparator into which an input signal Vin is inputted. In this embodiment, the voltage of the input signal Vin decides which switch is turned on, namely, which light-emitting element is caused to emit light as described above. The threshold generation circuit 100 generates the threshold of this voltage. The threshold generation circuit 100 has outputs connected to the comparators.

Figure 4:
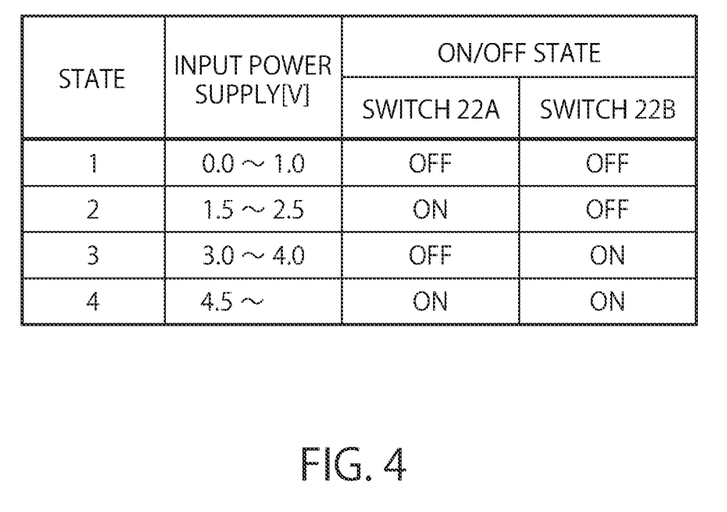
FIG. 4 illustrates a state of the switch with respect to an analog input according to an embodiment.

FIG. 4 is a table listing examples of associating the input signal Vin and the ON/OFF state of the switch in the case where two switches 22 exist. The state is a state indicating the combination of ON/OFF of the two switches. In a state 1, the input signal Vin between 0.0 V to 1.0 V is applied, indicating that both the switches 22A, 22B are turned off. Similarly, in a state 2, the input signal Vin is between 1.5 V and 2.5 V, the switch 22A is turned on and the switch 22B is turned off. In a state 3, the input signal Vin is between 3.0 V and 4.0 V, the switch 22A is turned off and the switch 22B is turned on. In a state 4, the input signal Vin is 4.5 V or more, both the switches 22A, 22B are turned on. As described above, the combination of the states of the two switches is decided depending on the state of the input signal Vin.

In the case where the states of the switches are decided by the input signal Vin as illustrated in FIG. 4, the threshold generation circuit 100 generates a threshold voltage that becomes, for example, 1.25 V as a voltage for discriminating between the state 1 and the state 2, 2.75 V as a voltage for discriminating between the state 2 and the state 3, and 4.25 V as a voltage for discriminating between the state 3 and the state 4. In the case where the relation between the input signal Vin and the states of the switches is different from those in FIG. 4, an appropriate threshold voltage is generated according to each case. This also applies to the case where the number of switches is increased. Further, the input signal corresponding to the state may include a certain degree of buffer and a voltage existing in the buffer may be set as the threshold voltage as described above. This makes it possible for the input signal Vin to have a certain degree of tolerance.

Returning to FIG. 3, the comparator 102, 104, 106 performs comparison whether the input signal Vin is higher or lower than the threshold voltage based on the threshold voltage generated by the threshold generation circuit 100 and inputted thereto. The comparator 102, 104, 106 outputs, for example, a signal of High when the input signal Vin is higher than the threshold voltage and a signal of LOW when the input signal Vin is lower than the threshold voltage. In the example of FIG. 3 and FIG. 4, the threshold generation circuit 100 generates and inputs a threshold voltage of 1.25 V into the comparator 102, a threshold voltage of 2.75 V into the comparator 104, and a threshold voltage of 4.25 V into the comparator 106.

The input signals are compared with the respective thresholds by the respective comparators and converted to the signals of High or Low as described above. Conversion to High and Low enables conversion to signals representing the state 1 to the state 4. For example, assuming that the output from the comparator 102 is S102, the output from the comparator 104 is S104, and the output from the comparator 106 is S106, the state 1 is expressed as nS102•nS104•nS106. Similarly, the state 2 is expressed as S102•nS104•nS106, the state 3 is expressed as S102•S104•nS106, and the state 4 is expressed as S102•S104•S106. Here, "n" represents negation of a subsequent signal, and "•" represents a logical product.

For these states, signals representing the ON/OFF states of the switches, namely, signals to the control circuits 12A, 12B to drive the light-emitting elements 14A, 14B are expressed as S22A, S22B. In this state, the following expressions are established.

$$nS102 \bullet nS104 \bullet nS106 = nS22A \bullet nS22B,$$

$$S102 \bullet nS104 \bullet nS106 = S22A \bullet nS22B,$$

$$S102 \bullet S104 \bullet nS106 = nS22A \bullet S22B,$$

$$S102 \bullet S104 \bullet S106 = S22A \bullet S22B.$$

Arranging these expressions regarding S22A, S22B results in the following expressions.

$$S22A = S102 \bullet nS104 \bullet nS106 + S102 \bullet S104 \bullet S106,$$

$$S22B = S102 \bullet S104,$$

where "+" represents a logical sum.

Illustrating the above expressions by a circuit results in a logic circuit connected to the outputs of the comparators 102, 104, 106 in FIG. 3. As an example, the logical product circuits 108, 110 and the logical sum circuit 112 are used to generate S22A, namely, an output signal to the control circuit 12A, and the logical product circuit 114 is used to generate an output signal to the control circuit 12B. Each of the signals inputted into the control circuits 12A, 12B is, for example, a signal of High or Low outputted from the logical sum circuit 112 or the logical product circuit 114. Each of the control circuits 12A, 12B drives the light-emitting element 14A, 14B to emit light when the signal of High is inputted, and does not drive the light-emitting element 14A, 14B when the signal of Low is inputted.

As described above, according to this embodiment, it becomes possible to mount the selection circuit 10*a* that switches between the plurality of switches with respect to one input by converting the combination of the switches to voltage when the input signal Vin is the analog signal, namely, a signal for switching between the switches by the value of the voltage.

Note that the above-described logic circuit is illustrated as one example, and other implementations of outputting the similar signal are adoptable. For example, deformation of S22A=S102•(nS104•nS106+S104•S106) may be performed to express this expression by three logical product circuits and one logical sum circuit. Further, deformation of this expression to S22A=S102•(exclusive logical sum of n(S104 and S106)) may be performed to express this expression by a logic circuit. As described above, one logical operation can be expressed by numerous combinations of logical operations, and therefore various implementations can be performed in consideration of the mounting area of the circuit and the like, the combination of logical operations of other switches and the like.

Further, as in the above-described embodiment, the number of switches is not always limited to two, but it is possible, also for three or more switches, to similarly perform switching among the switches by one input by appropriately providing the threshold voltage, the comparator, and the logic circuit. For example, n switches are provided, the threshold generation circuit 100 generates $2^{n-1}$ threshold voltages and includes the same number of comparators as that of the thresholds and thereby can express all of combinations. In this case, it becomes possible to arbitrarily switch among n switches with respect to one input.

Further, the selection circuit 10a according to this embodiment does not always need to include the threshold generation circuit 100. For example, the threshold generation circuit 100 may be provided outside the semiconductor device 1, and a terminal for accepting an input of the threshold voltage may be provided. In this case, an amplifier circuit that accepts a threshold (for example, 1.4 V) being a reference and makes it predetermined times (for example, one time, two times, three times) may be provided, and an output of the amplifier circuit may be inputted as a threshold voltage to each of the comparators.

Third Embodiment

In this embodiment, the signal to be inputted is a digital signal, and the selection circuit 10 is configured to cause a predetermined light-emitting element 14 to emit light based on a duty ratio of the digital signal when the digital signal, for example, a PWM (Pulse Width Modulation) signal is inputted thereto.

Figure 5:
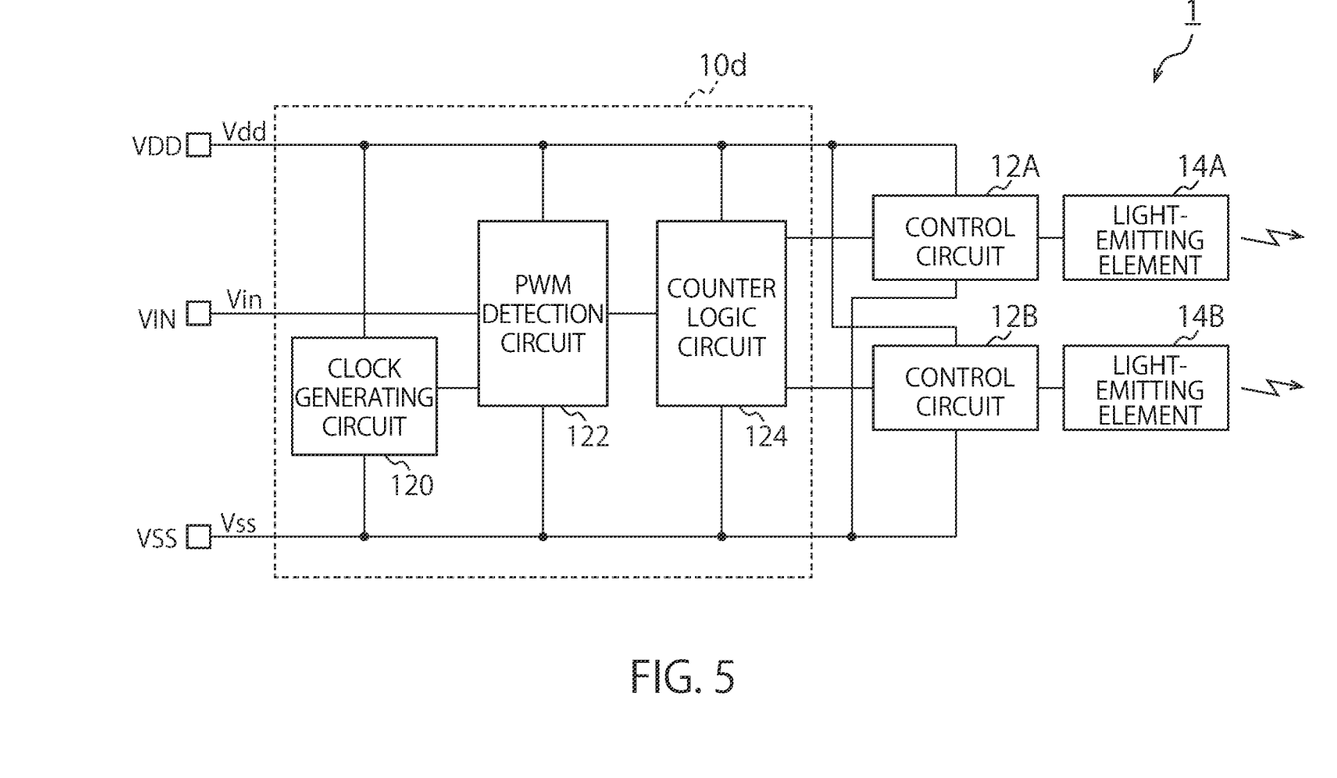
FIG. 5 illustrates an example of a circuit on an input side according to an embodiment.

FIG. 5 is a diagram illustrating a configuration on an input side according to this embodiment and, in particular, a diagram illustrating a concrete example of the selection circuit 10. A selection circuit 10d includes a clock generating circuit 120, a PWM detection circuit 122, and a counter logic circuit 124. The clock generating circuit 120, the PWM detection circuit 122, and the counter logic circuit 124 are appropriately connected to VDD and VSS at terminals that receive input of reference voltages.

The clock generating circuit 120 is a circuit that generates and outputs a clock signal for confirming the pulse width of the input signal Vin. More specifically, the clock generating circuit 120 is a circuit that generates a clock signal for acquiring the duty ratio of the PWM when the input signal Vin is a signal of a PWM mode. The clock generating circuit 120 is connected to the PWM detection circuit 122 and outputs the generated clock signal to the PWM detection circuit 122. The clock signal to be generated is, for example, a pulse having a frequency of a reciprocal of a pulse width that is equivalent to or smaller than the minimum pulse width of PWM.

The clock generating circuit 120 does not need to be always provided inside the semiconductor device 1, but may be provided with a terminal that receives the clock signal being a reference and accept the clock signal from the external part. In this case, it is possible to decide the specifications and the like of PWM outside the semiconductor device 1.

The PWM detection circuit 122 is connected to the input terminal VIN and the clock generating circuit 120 and detects the PWM signal being the input signal Vin on the basis of the clock signal generated by the clock generating circuit 120. For example, the PWM detection circuit 122 outputs a signal at timing when the input signal Vin is High, on the basis of the clock signal generated by the clock generating circuit 120, and outputs the signal to the counter logic circuit 124.

The counter logic circuit 124 calculates the duty ratio of the input signal Vin, based on the signal outputted from the PWM detection circuit 122, and then outputs a signal to the control circuit corresponding to each switch using the logic circuit so as to control the light-emitting element.

Figure 6:
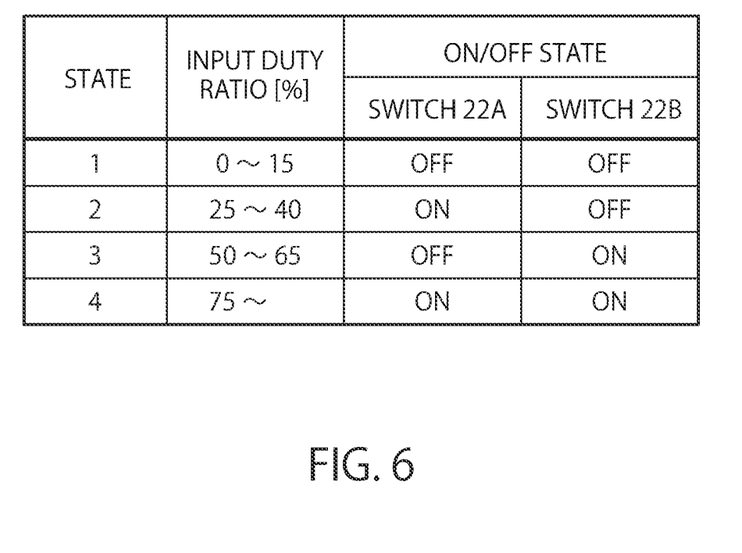
FIG. 6 illustrates a state of the switch with respect to a digital input according to an embodiment.

FIG. 6 is a table listing examples of associating the input signal Vin and the ON/OFF states of the switches in the case where two switches 22 exist. Similarly to the above embodiment, the state is a state indicating the combination of ON/OFF of the two switches. In a state 1, the duty ratio of the input signal Vin is between 0 and 15%, indicating that both the switches 22A, 22B are turned off. Similarly, in a state 2, the duty ratio of the input signal Vin is between 25 and 40%, and the switch 22A is turned on and the switch 22B is turned off. In a state 3, the duty ratio of the input signal Vin is between 50 and 65%, and the switch 22A is turned off and the switch 22B is turned on. In a state 4, the duty ratio of the input signal Vin is 75% or more, and both the switches 22A, 22B are turned on. As described above, the combination of the states of the two switches is decided by the duty ratio of the input signal Vin.

The counter logic circuit 124 monitors how many signals of High have been sequentially outputted from the PWM detection circuit 122, for example, based on the clock signal, and detects the duty ratio of the input signal Vin according to the number of signals of High sequentially outputted. In another example, the counter logic circuit 124 may monitor how many signals of High have been inputted per unit time and acquire the duty ratio. Then, based on the duty ratio, a logic circuit similar to the logic circuit according to the above embodiment outputs the signal of High or Low to the control circuits 12A, 12B so as to switch the ON/OFF states of the switches.

The subsequent operation of the control circuit 12 and the like is the same as that in the above embodiment.

As described above, according to this embodiment, it becomes possible to switch the states of a plurality of switches on the basis of the signal of one input including the digital signal, for example, the PWM signal. Since this embodiment uses the digital signal as the input signal unlike the above embodiment using the analog signal as the input signal, it becomes possible to separately use the analog signal and the digital signal as the input signal Vin.

Though the signal by PWM is inputted, a signal modulated by other mode such as PAM (Pulse Amplitude Modulation), PPM (Pulse Position Modulation), PDM (Pulse Density Modulation), PCM (Pulse Code Modulation) or the like may be received as the input signal by the design of the selection circuit 10.

Modified Example

The state is read, but not limited to, in a digital form from the PWM signal being the input signal Vin in the above third embodiment. For example, the input signal Vin is made as the PWM signal as in the third embodiment, and the PWM signal may be converted into an analog signal.

Figure 7:
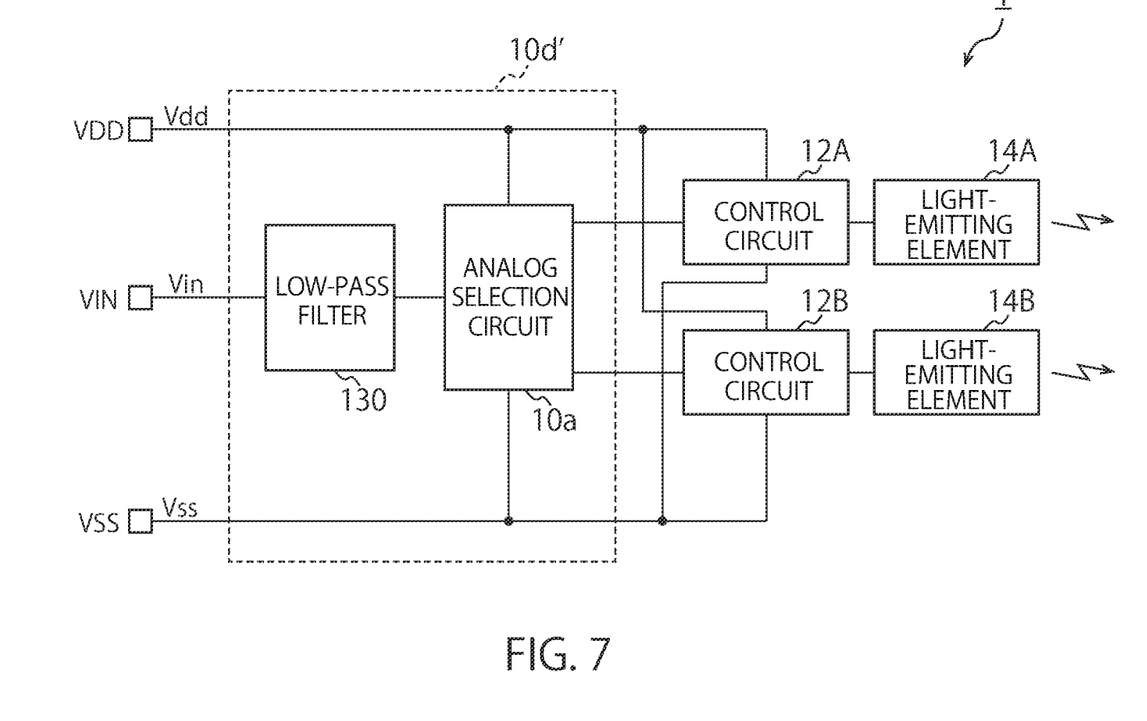
FIG. 7 illustrates an example of a circuit on an input side according to an embodiment.

FIG. 7 is a diagram illustrating a selection circuit 10d' of the semiconductor device 1 according to this modified example. The selection circuit 10d' includes a low-pass filter 130 and an analog selection circuit 10a. The analog selection circuit 10a is equivalent to the selection circuit 10a according to the above second embodiment.

The low-pass filter 130 is a filter that is connected between the input terminal VIN and the analog selection circuit 10a and removes a high-frequency component of the input signal Vin. The low-pass filter 130 outputs, when the PWM signal is inputted thereinto, an analog signal being an average voltage of the inputted PWM signal.

The analog selection circuit 10a reads, as in the above second embodiment, the inputted voltage, namely, the voltage value of the input signal Vin converted into the analog signal (average voltage) by the low-pass filter 130, and is connected to the control circuit 12 via the comparator and the logic circuit. The operation of the analog selection circuit 10a is the same as that in the above second embodiment, and therefore detailed description thereof is omitted.

Also in the case where the digital signal being the PWM signal is the input signal Vin as described above, the PWM signal is converted into an analog signal via the low-pass filter 130, thereby making it possible to form the same selection circuit as that in the second embodiment.

The means that drives the switches 22A, 22B according to the optical coupling mode of receiving light by the light-receiving elements 20A, 20B as signal receiving elements while keeping the insulating states of light from the light-emitting elements 14A, 14B is described as an example as the signal transmitting elements in each of the above embodiments, but the signal transmitting elements are not limited to this. More specifically, a configuration capable of receiving the signal transmitted from a predetermined signal transmitting element by an appropriate signal receiving element is adoptable. Not only an insulation device such as an optical coupling device but also an insulation device that drives a switch in a non-contact manner, for example, by a galvanic insulation element of magnetic coupling, capacitive coupling or the like is also adoptable.

In the case of generating voltage for driving the switch according to the magnetic coupling, for example, a coil on a transmission or power transmitting chip side (signal transmitting element side) and a coil on a reception or power receiving chip side (signal receiving element side) may be arranged to be magnetically coupled and may convert an induced current into voltage and output the voltage. Alternatively, it is adoptable to provide an electrode on the signal transmitting element side and provide another parallel-plate electrode on the signal receiving element side, and capacitively couple them to apply voltage. A configuration capable of transmitting and receiving an electromagnetic signal other than an optical signal in a non-contact (contactless) state.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the signal outputted from the selection circuit 10 to the control circuit 12 is, but not limited to, a signal of High or Low in each of the above embodiments, and the signal only needs to be a signal capable of representing a state desired to be appropriately controlled. As another example, High and Low may be reversed. Alternatively, the signal may be a signal that represents the frequency or the like of a periodic signal or the ON/OFF state of the switch by a signal coded by appropriate coding so that the control circuit 12 can appropriately read the state.

The invention claimed is:

1. A semiconductor device comprising:
   light-emitting elements;
   a selection circuit configured to accept one input signal and output a signal for selecting an element to emit light among the light-emitting elements;
   a control circuit configured to control the light-emitting elements, based on the signal outputted from the selection circuit;
   light-receiving elements each configured to receive light of each of the light-emitting elements and generate a signal for driving a switch, based on a light-receiving state; and
   switch elements each configured to be driven by application of voltage outputted from each of the light-receiving elements,
   wherein the input signal is an analog signal that transmits a signal, based on a voltage value thereof; and
   the selection circuit includes comparators and outputs a signal for selecting one of the light-emitting elements to be driven, based on a voltage value of the input signal.

2. The semiconductor device according to claim 1, wherein:
   the light-emitting elements are LEDs; and
   the control circuit performs control of driving each of the LEDs.

3. The semiconductor device according to claim 1, wherein:
   the light-receiving elements are photodiodes;
   the switch elements are transistors; and
   the transistors are driven by outputs of the photodiodes.

4. The semiconductor device according to claim 2, wherein:
   the light-receiving elements are photodiodes;
   the switch elements are transistors; and
   the transistors are driven by outputs of the photodiodes.

5. The semiconductor device according to claim 3, wherein
   the transistors are MOSFETs whose drive states are decided by application of voltage to gates thereof, based on the outputs of the photodiodes.

6. The semiconductor device according to claim 4, wherein
   the transistors are MOSFETs whose drive states are decided by application of voltage to gates thereof, based on the outputs of the photodiodes.

7. The semiconductor device according to claim 1, further comprising:
   a threshold generation circuit configured to generate a threshold with respect to each of the comparators.

8. The semiconductor device according to claim 2, further comprising:
   a threshold generation circuit configured to generate a threshold with respect to each of the comparators.

9. The semiconductor device according to claim 3, further comprising:
   a threshold generation circuit configured to generate a threshold with respect to each of the comparators.

10. A semiconductor device comprising:
    light-emitting elements;
    a selection circuit configured to accept one input signal and output a signal for selecting an element to emit light among the light-emitting elements;

a control circuit configured to control the light-emitting elements, based on the signal outputted from the selection circuit;
light-receiving elements each configured to receive light of each of the light-emitting elements and generate a signal for driving a switch, based on a light-receiving state; and
switch elements each configured to be driven by application of voltage outputted from each of the light-receiving elements, wherein
the input signal is a digital signal of a PWM mode, and the selection circuit outputs a signal for selecting one of the light-emitting elements to be driven, based on a duty ratio of the digital signal.

11. The semiconductor device according to claim 10, wherein
the light-emitting elements are LEDs; and
the control circuit performs control of driving each of the LEDs.

12. The semiconductor device according to claim 10, wherein
the light-receiving elements are photodiodes;
the switch elements are transistors; and
the transistors are driven by outputs of the photodiodes.

13. The semiconductor device according to claim 10, further comprising:
a PWM detection circuit configured to detect that the input signal is of the PWM mode.

14. The semiconductor device according to claim 11, further comprising:
a PWM detection circuit configured to detect that the input signal is of the PWM mode.

15. The semiconductor device according to claim 12, further comprising:
a PWM detection circuit configured to detect that the input signal is of the PWM mode.

16. A semiconductor device comprising:
signal transmitting elements;
a selection circuit configured to accept one input signal and output a signal for selecting an element to transmit a signal among the signal transmitting elements;
a control circuit configured to control the signal transmitting elements, based on the signal outputted from the selection circuit;
signal receiving elements each configured to receive the signal transmitted from each of the signal transmitting elements and generate voltage for driving a switch, based on a receiving state; and
switch elements each configured to be driven by application of voltage outputted from each of the signal receiving elements,
wherein the input signal is an analog signal that transmits a signal, based on a voltage value thereof; and
the selection circuit includes comparators and outputs a signal for selecting one of the signal transmitting elements to be driven, based on a voltage value of the input signal.

17. The semiconductor device according to claim 16, wherein
the signal transmitting elements are magnetically or capacitively coupled with the signal receiving elements.

18. A semiconductor device comprising:
signal transmitting elements;
a selection circuit configured to accept one input signal and output a signal for selecting an element to transmit a signal among the signal transmitting elements;
a control circuit configured to control the signal transmitting elements, based on the signal outputted from the selection circuit;
signal receiving elements each configured to receive the signal transmitted from each of the signal transmitting elements and generate voltage for driving a switch, based on a receiving state; and
switch elements each configured to be driven by application of voltage outputted from each of the signal receiving elements,
wherein the input signal is a digital signal of a PWM mode, and the selection circuit outputs a signal for selecting one of the signal transmitting elements to be driven, based on a duty ratio of the digital signal.

19. The semiconductor device according to claim 18, wherein
the signal transmitting elements are magnetically or capacitively coupled with the signal receiving elements.

* * * * *